United States Patent
Hino

(10) Patent No.: US 10,193,518 B2
(45) Date of Patent: Jan. 29, 2019

(54) RADIO-FREQUENCY (RF) COMPONENT

(71) Applicant: Murata Manufacturing Co., Ltd., Kyoto (JP)

(72) Inventor: Seigo Hino, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/417,688

(22) Filed: Jan. 27, 2017

(65) Prior Publication Data

US 2017/0141752 A1 May 18, 2017

Related U.S. Application Data

(63) Continuation of application No. PCT/JP2015/073957, filed on Aug. 26, 2015.

(30) Foreign Application Priority Data

Sep. 18, 2014 (JP) .................. 2014-189579

(51) Int. Cl.
*H03H 7/01* (2006.01)
*H03H 7/46* (2006.01)
(Continued)

(52) U.S. Cl.
CPC .......... *H03H 7/17* (2013.01); *H01F 27/2804* (2013.01); *H01L 25/00* (2013.01);
(Continued)

(58) Field of Classification Search
CPC ......... H03H 2001/0085; H03H 9/0566; H03H 7/463; H03H 7/0115; H01P 3/088; H01P 1/20345
USPC .......................................................... 333/185
See application file for complete search history.

(56) References Cited

U.S. PATENT DOCUMENTS

2003/0148739 A1    8/2003  Kosemura
2005/0068126 A1*   3/2005  Muto .................. H01P 1/20381
                                                        333/204

(Continued)

FOREIGN PATENT DOCUMENTS

CN        101266964 A     9/2008
JP       2004-296927 A   10/2004
(Continued)

OTHER PUBLICATIONS

International Search Report issued in Patent Application No. PCT/JP2015/073957 dated Oct. 13, 2015.
(Continued)

*Primary Examiner* — Rakesh Patel
(74) *Attorney, Agent, or Firm* — Pearne & Gordon LLP

(57) ABSTRACT

First no-electrode-forming areas where first wiring electrodes such as internal wiring electrodes and external connection terminals are not formed are set to ranges that overlap inductor components in a plan view of at least one of dielectric layers of a first substrate, and second no-electrode-forming areas where second wiring electrodes such as internal wiring electrodes and mounting electrodes are not formed are set to ranges that overlaps the inductor components in a plan view of at least one of dielectric layers of a second substrate. Accordingly, reduction of the inductance of the inductor components, which is caused by the first and second wiring electrodes crossing the magnetic field of the inductor components, can be suppressed. Therefore, the overall component size can be reduced without deteriorating the Q value of the inductor components by configuring an RF component with a stacking structure.

21 Claims, 12 Drawing Sheets

(51) Int. Cl.
*H01P 3/08* (2006.01)
*H01P 1/203* (2006.01)
*H01L 25/00* (2006.01)
*H04B 1/40* (2015.01)
*H01F 27/28* (2006.01)
*H03H 7/06* (2006.01)
*H04B 1/525* (2015.01)
*H03H 9/05* (2006.01)

(52) U.S. Cl.
CPC .......... *H01P 1/20345* (2013.01); *H01P 3/088* (2013.01); *H03H 7/0115* (2013.01); *H03H 7/06* (2013.01); *H03H 7/463* (2013.01); *H04B 1/40* (2013.01); *H04B 1/525* (2013.01); *H01F 2027/2809* (2013.01); *H01L 2224/32225* (2013.01); *H01L 2924/0002* (2013.01); *H01L 2924/15311* (2013.01); *H03H 9/0542* (2013.01); *H03H 9/0547* (2013.01); *H03H 9/0566* (2013.01)

(56) References Cited

U.S. PATENT DOCUMENTS

| | | |
|---|---|---|
| 2005/0212612 A1 | 9/2005 | Kawakubo |
| 2008/0211067 A1 | 9/2008 | Nakashiba |
| 2008/0272495 A1 | 11/2008 | Nakashiba |
| 2009/0278626 A1* | 11/2009 | Lee ...................... H03H 7/0115 333/185 |
| 2011/0090665 A1* | 4/2011 | Korony .................. H01C 1/148 361/821 |
| 2013/0234286 A1 | 9/2013 | Nakashiba |
| 2013/0328640 A1 | 12/2013 | Tsutsumi |

FOREIGN PATENT DOCUMENTS

| | | |
|---|---|---|
| JP | 3666411 B2 | 6/2005 |
| JP | 2005-217852 A | 8/2005 |
| JP | 2006-261387 A | 9/2006 |
| JP | 2008-218566 A | 9/2008 |
| JP | 2013-102194 A | 5/2013 |
| JP | 2013-258516 A | 12/2013 |
| JP | 2014-014131 A | 1/2014 |

OTHER PUBLICATIONS

Written Opinion issued in Patent Application No. PCT/JP2015/073957 dated Oct. 13, 2015.

* cited by examiner

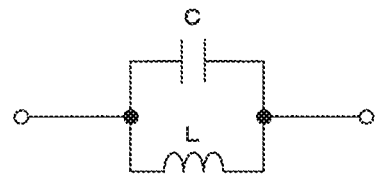
FIG. 5A
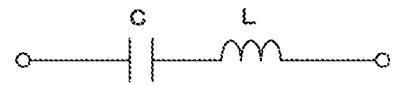
FIG. 5B
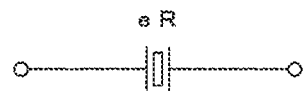
FIG. 5C
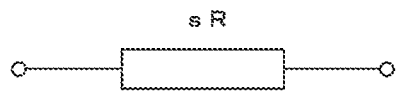
FIG. 5D
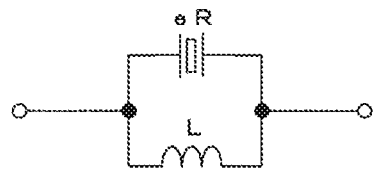
FIG. 5E
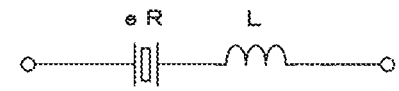
FIG. 5F
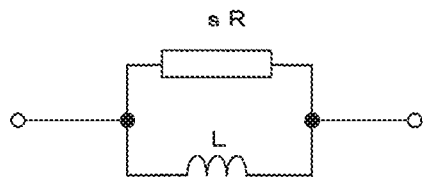
FIG. 5G
FIG. 6
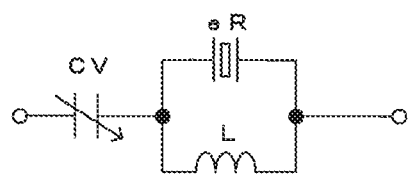

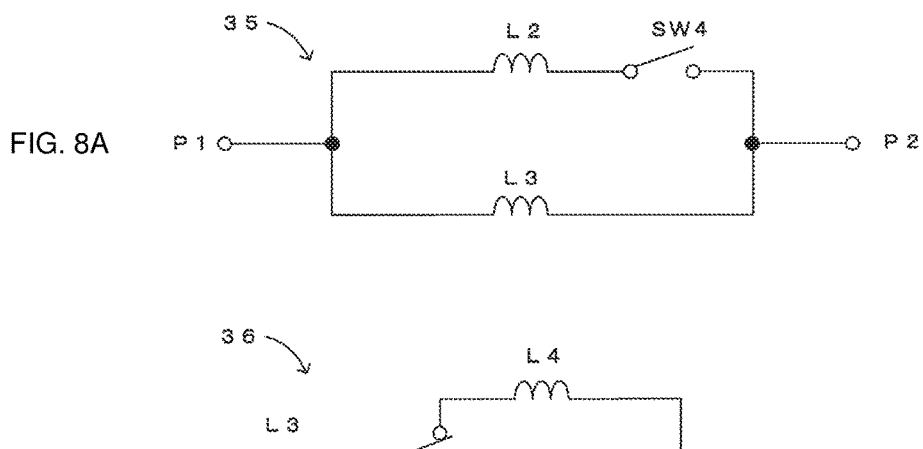

PRIOR ART

RADIO-FREQUENCY (RF) COMPONENT

This is a continuation of International Application No. PCT/JP2015/073957 filed on Aug. 26, 2015 which claims priority from Japanese Patent Application No. 2014-189579 filed on Sep. 18, 2014. The contents of these applications are incorporated herein by reference in their entireties.

BACKGROUND OF THE DISCLOSURE

Field of the Disclosure

The present disclosure relates to a radio-frequency (RF) component with a stacking structure.

Description of the Related Art

Hitherto, RC components configured with a stacking structure in order to reduce the component size in a plan view have been provided (for example, see Patent Document 1). The stacking structure is a structure where, like an RF component 500 with a stacking structure of the related art illustrated in FIG. 15, spacer members 502 are placed on a top face of a first substrate 501, and a second substrate 503 is stacked on the spacer members 502. Thus, the first substrate 501 on which various components 504 are mounted and the second substrate 503 on which various components 505 are mounted are arranged so as to be spaced from each other in a direction orthogonal to component mounting faces of the substrates 501 and 503. In the example illustrated in FIG. 15, the components 504 and 505 are arranged between the first substrate 501 and the second substrate 503.

Patent Document 1: Japanese Unexamined Patent Application Publication No. 2006-261387 (paragraphs 0046, 0047, 0049, 0060, FIG. 1, Abstract, and so forth)

BRIEF SUMMARY OF THE DISCLOSURE

The first substrate 501 and the second substrate 503 are each formed of a multilayer substrate. Accordingly, the components 504 and 505 and wiring electrodes provided in the substrates 501 and 503 form complicated circuits in the RF component 500. However, the following problem may occur if the components 504 and 505 include an inductor component. That is, when the inductor component approaches the wiring electrodes in the substrates 501 and 503, eddy currents are induced in the wiring electrodes in a direction that prevents a change in magnetic flux of the inductor component, thereby changing the inductance of the inductor component. When eddy currents flow in the wiring electrodes, power is consumed, thereby increasing the equivalent series resistance of the inductor component. Therefore, the Q value of the inductor component becomes lower. In this case, the insertion loss characteristics of the RF component 500 are deteriorated. Even when an inductor component is placed between the first substrate 501 and the second substrate 503 of the RF component 500 with a stacking structure, no sufficient investigation has been done with regard to the effects of the positional relationship between the wiring electrodes formed in the first substrate 501 and the second substrate 503 and the inductor component on the characteristics of the RF component 500.

In view of the above-described circumstances, it is an object of the present disclosure to provide technologies for reducing the overall component size without deteriorating the Q value of an inductor component.

In order to achieve the foregoing object, a radio-frequency component according to the present disclosure includes: a first substrate in or on which a first wiring electrode is formed, the first substrate being formed by stacking a plurality of insulating layers; a spacer member placed on a first main face of the first substrate; a second substrate in or on which a second wiring electrode is formed, the second substrate being formed by stacking a plurality of insulating layers, the second substrate being spaced from the first substrate by being stacked on the spacer member; and an inductor component mounted on the first main face of the first substrate. A first no-electrode-forming area where the first wiring electrode is not formed is set to a range that overlaps the inductor component in a plan view of at least one of the insulating layers of the first substrate. A second no-electrode-forming area where the second wiring electrode is not formed is set to a range that overlaps the inductor component in a plan view of at least one of the insulating layers of the second substrate.

In the disclosure configured as above, a first no-electrode-forming area where the first wiring electrode is not formed is set to a range that overlaps the inductor component in a plan view of at least one of the insulating layers of the first substrate, and a second no-electrode-forming area where the second wiring electrode is not formed is set to a range that overlaps the inductor component in a plan view of at least one of the insulating layers of the second substrate. Accordingly, the amount of the first and second wiring electrodes arranged near the inductor component can be reduced. This can reduce eddy currents induced in the first and second wiring electrodes, thereby suppressing the reduction of the inductance of the inductor component. Therefore, the overall component size can be reduced without deteriorating the Q value of the inductor component by configuring the radio-frequency component with a stacking structure.

It is preferable that the radio-frequency component further include a filter, and the inductor component form at least a part of the filter.

In doing so, because the deterioration of the Q value of the inductor component forming at least a part of the filter is suppressed, the deterioration of the characteristics of the filter can be suppressed.

It is preferable that the filter include a resonance circuit, and the inductor component form at least a part of the resonance circuit.

In doing so, because the inductor component whose Q value deterioration is suppressed forms at least a part of the resonance circuit, the deterioration of the Q value of the resonance circuit can be suppressed. In addition, because the deterioration of the Q value of the filter including the resonance circuit is also suppressed, the deterioration of the characteristics of the filter can be suppressed.

The filter may include a variable reactance circuit.

With such a configuration, because the filter includes a variable reactance circuit, the passband of the filter can be changed by the variable reactance circuit in accordance with the frequency band of a radio-frequency (RF) signal that passes through the filter. Thus, because a filter that copes with RF signals in a plurality of frequency bands can be formed of one circuit, the size of the filter can be reduced. In addition, an RF component that can cope with a plurality of RF signals in different frequency bands can be provided.

The radio-frequency component may further include another component placed between the first substrate and the second substrate, and the other component may be placed at a position not overlapping with the inductor component in a plan view.

With such a configuration, because another component is provided, a further complicated circuit can be configured in the radio-frequency component. Because this other component is placed at a position not overlapping with the inductor component in a plan view, this other component can be prevented from interfering with the inductor component and deteriorating the characteristics thereof.

It is preferable that the radio-frequency component further include another inductor component mounted on a face of the second substrate, the face facing the first substrate, and it is preferable that the other inductor component be placed at a position overlapping with the inductor component in a plan view.

In doing so, because another inductor component is placed at a position overlapping with the inductor component in a plan view, the deterioration of the characteristics of this other inductor component can also be suppressed by the first no-electrode-forming area and the second no-electrode-forming area. Thus, it is not necessary to newly set a no-electrode-forming area corresponding to the other inductor component to each of the first substrate and the second substrate. Therefore, the first and second substrates can be reliably provided with areas for forming the first and second wiring electrodes, thereby enhancing the degree of freedom in designing the first and second wiring electrodes in the first and second substrates.

It is preferable that the first no-electrode-forming area be set to a range that overlaps the inductor component in a plan view of all the insulating layers except for an insulating layer near the first main face of the first substrate, and that the second no-electrode-forming area be set to a range that overlaps the inductor component in a plan view of all the insulating layers of the second substrate.

In doing so, besides a mounting electrode at which the inductor component is mounted, no other wiring electrodes are formed within ranges that overlap with the inductor component in a plan view, thereby more effectively suppressing the deterioration of the characteristics (Q value) of the inductor component.

Among a plurality of first wiring electrodes formed in the first substrate, a first wiring electrode placed nearest to a second main face of the first substrate may be a ground electrode formed in a planar shape.

In doing so, the first wiring electrode formed as a ground electrode in a planar shape can improve the heat dissipation of the radio-frequency component, and can also improve the shielding property of the radio-frequency component.

According to the present disclosure, the first no-electrode-forming area where the first wiring electrode is not formed is set to a range that overlaps the inductor component in a plan view of at least one of the insulating layers of the first substrate, and the second no-electrode-forming area where the second wiring electrode is not formed is set to a range that overlaps the inductor component in a plan view of at least one of the insulating layers of the second substrate. Accordingly, the reduction of the inductance of the inductor component, which is caused by the first and second wiring electrodes crossing the magnetic field of the inductor component, can be suppressed. Therefore, the overall component size can be reduced without deteriorating the Q value of the inductor component by configuring the RF component with a stacking structure.

BRIEF DESCRIPTION OF THE SEVERAL VIEWS OF THE DRAWINGS

FIG. 1 is a cross-sectional view of the RF component illustrated in FIG. 1, viewed from a lateral face, illustrating the arrangement relationship between inductor components and internal wiring electrodes.

FIGS. 5A to 5G include diagrams illustrating examples of a resonance circuit included in a transmission filter and a reception filter, including FIGS. 5A to 5G illustrating different resonance circuits.

FIG. 6 is a diagram illustrating another example of a resonance circuit.

FIGS. 8A and 8B include diagrams illustrating examples of a variable reactance circuit that changes an inductive reactance, including FIGS. 8A and 8B illustrating different variable reactance circuits.

DETAILED DESCRIPTION OF THE DISCLOSURE

First Embodiment

Figure 1:
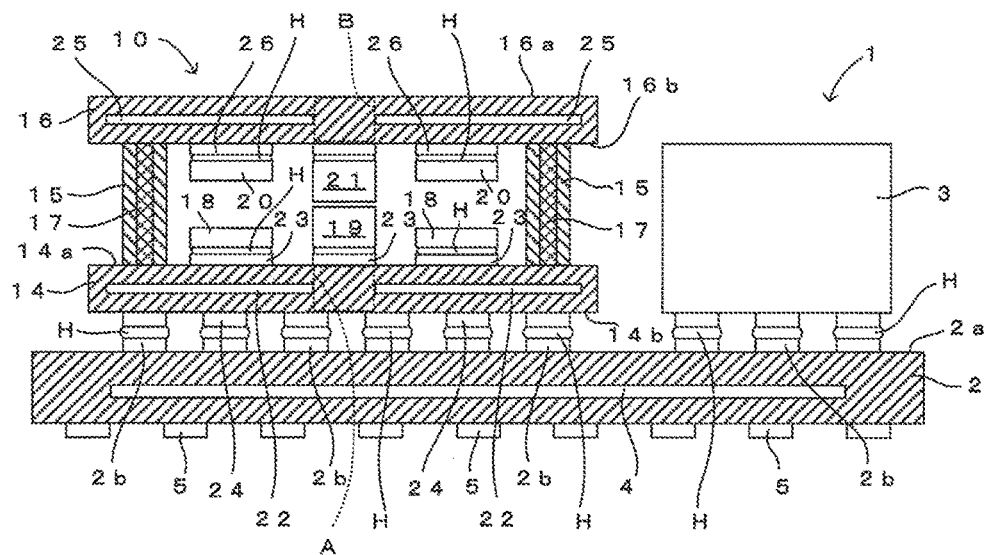
FIG. 1 is a partial cross-sectional view illustrating a front-end module with an RF component according to a first embodiment of the present disclosure.
Figure 2:
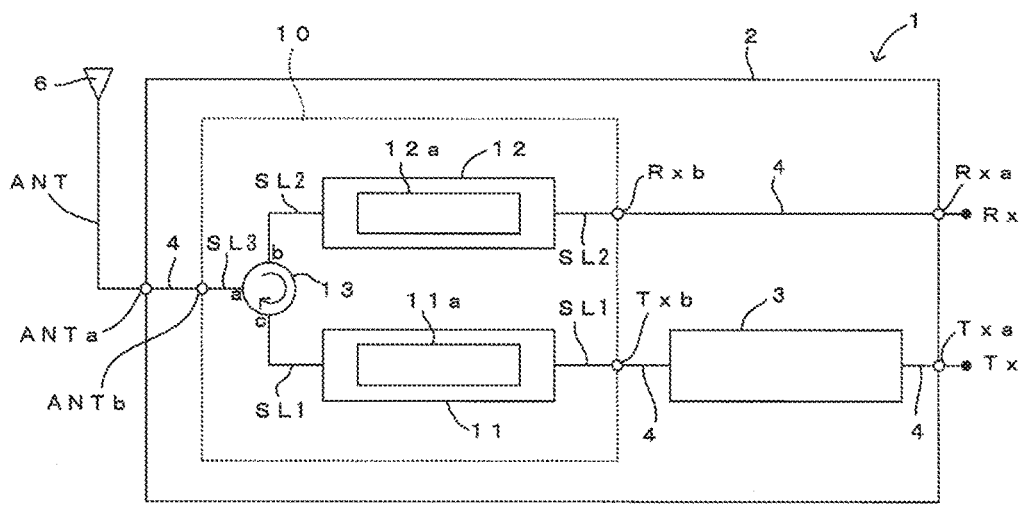
FIG. 2 is a circuit block diagram illustrating the electrical configuration of the front-end module illustrated in FIG. 1.
Figure 3:
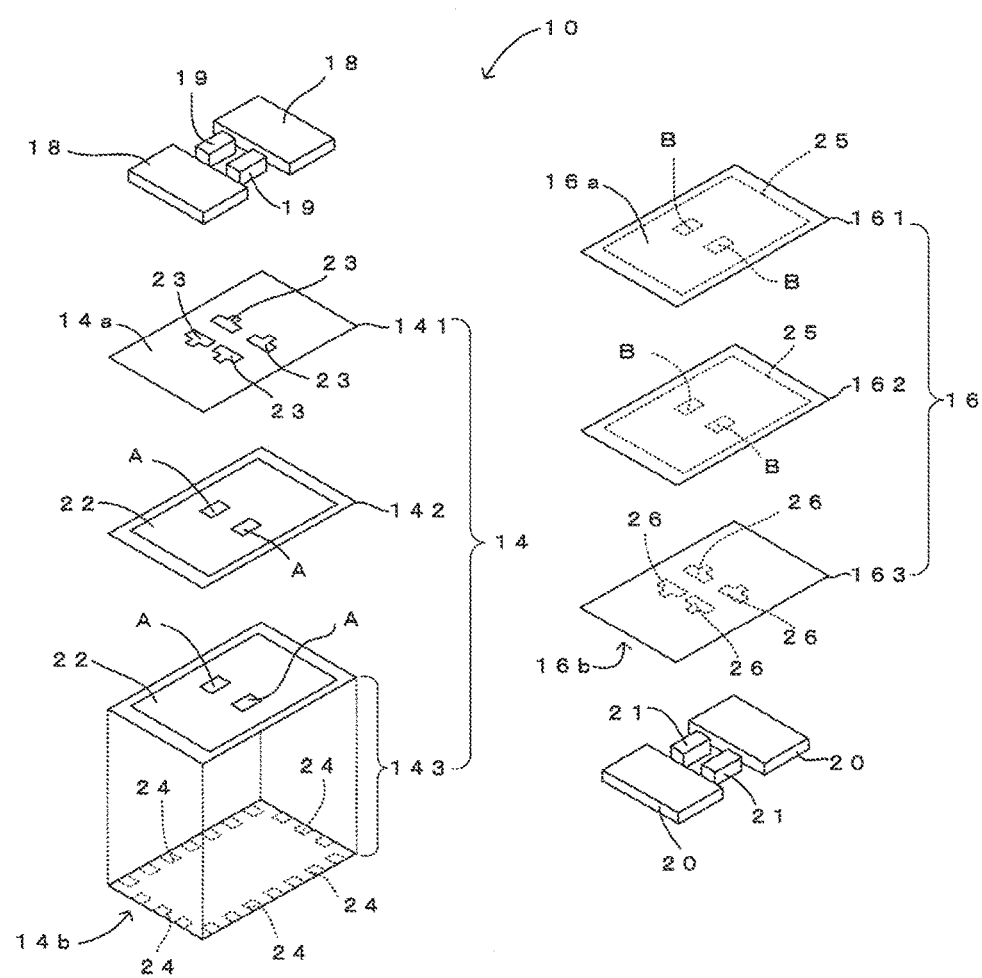
FIG. 3 is an exploded perspective view of the RF component illustrated in FIG. 1.
Figure 4:
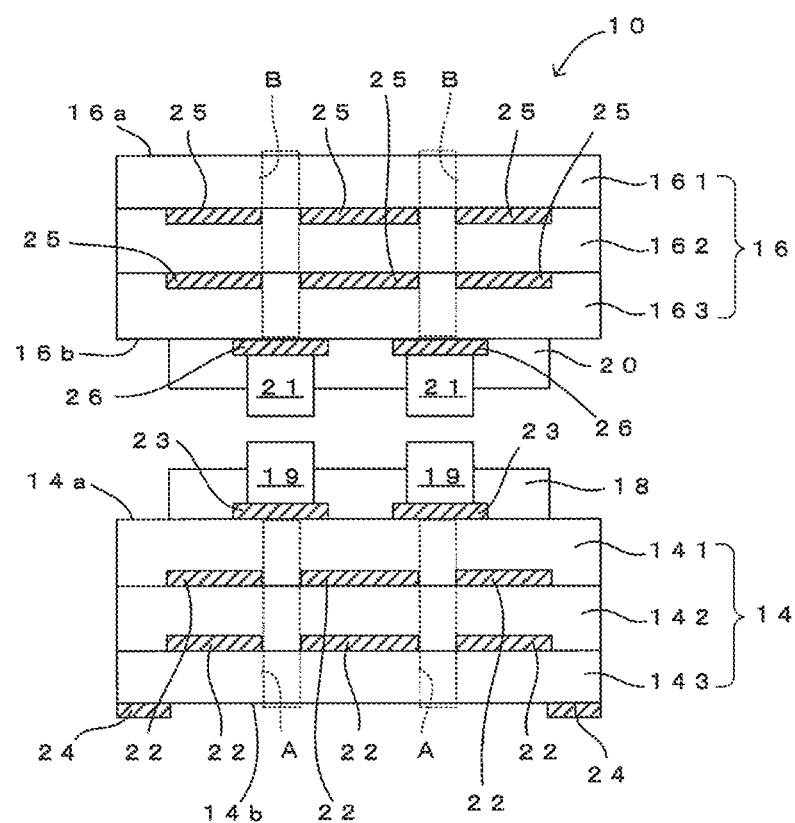

A front-end module with an RF component according to a first embodiment of the present disclosure will be described with reference to FIGS. 1 to 10. FIG. 1 is a partial cross-sectional view illustrating a front-end module with an RF component according to the first embodiment of the present disclosure. FIG. 2 is a circuit block diagram illustrating the electrical configuration of the front-end module illustrated in FIG. 1. FIG. 3 is an exploded perspective view of the RF component illustrated in FIG. 1. FIG. 4 is a cross-sectional view of the RF component illustrated in FIG. 1, viewed from a lateral face, illustrating the arrangement relationship between inductor components and internal wiring electrodes.

Figure 9A:
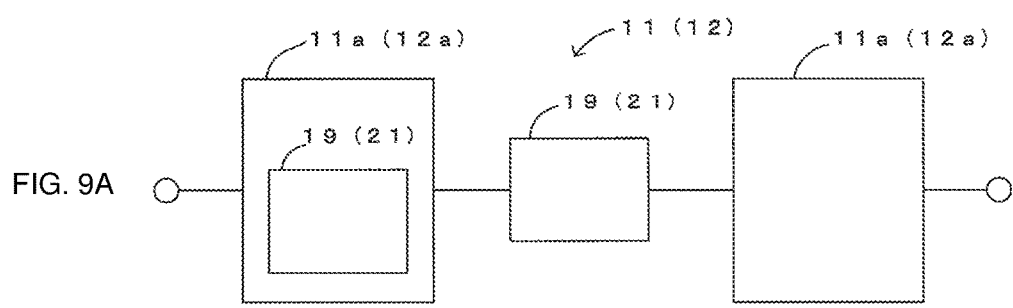
FIGS. 9A to 9C include diagrams illustrating examples of the circuit configuration of the transmission filter and the reception filter, FIGS. 9A to 9C illustrating different circuit configurations.
Figure 9B:
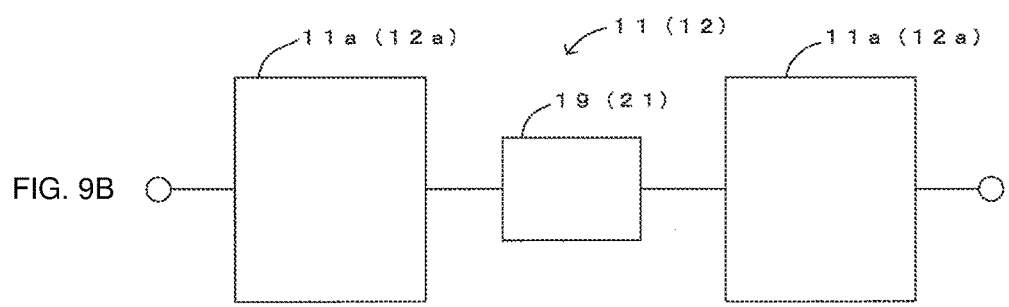
Figure 9C:
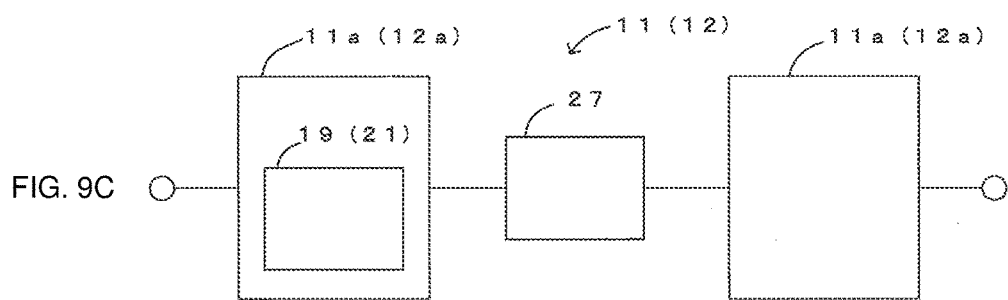
Figure 10:
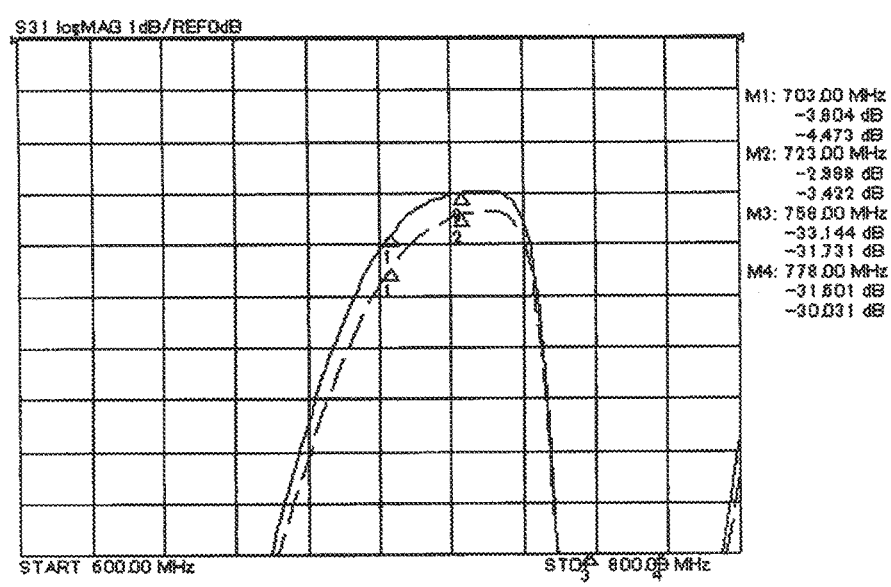
FIG. 10 is a diagram illustrating the passband characteristics of the transmission filter of the RF component illustrated in FIG. 1.

FIGS. 5A to 5G include diagrams illustrating examples of a resonance circuit included in a transmission filter and a reception filter, including FIGS. 5A to 5G illustrating different resonance circuits. FIG. 6 is a diagram illustrating another example of a resonance circuit. FIGS. 7A to 7E include diagrams illustrating examples of a variable reactance circuit that changes a capacitive reactance, including FIGS. 7A to 7E illustrating different variable reactance circuits. FIGS. 8A and 8B include diagrams illustrating examples of a variable reactance circuit that changes an inductive reactance, including FIGS. 8A and 8B illustrating different variable reactance circuits. FIGS. 9A to 9C include diagrams illustrating examples of the circuit configuration of the transmission filter and the reception filter, including FIGS. 9A to 9C illustrating different circuit configurations. FIG. 10 is a diagram illustrating the passband characteristics of the transmission filter of the RF component illustrated in FIG. 1.

Note that only the main configurations according to the present disclosure are illustrated in FIGS. 1 and 2, and other configurations are not illustrated to simplify the description. Also, only the main configurations are illustrated in the drawings to which the following description refer, like FIGS. 1 and 2, and descriptions thereof will be omitted in the following description.

(Front-End Module)

A front-end module 1 illustrated in FIGS. 1 and 2 is mounted on a motherboard included in a communication mobile terminal such as a cellular phone or a mobile information terminal and is placed immediately below an antenna device. In the embodiment, the front-end module 1 includes a module substrate 2, a power amplifier 3, and an RF component 10 including a transmission filter 11 and a reception filter 12. Although not illustrated in FIGS. 1 and 2, various components such as resistors, capacitors, and inductors for forming a rectifier circuit and a filter circuit, and various components such as a low-noise amplifier, a switch IC, and a filter IC are arbitrarily selected in accordance with functions necessary for the front-end module 1 and mounted in or on the module substrate 2.

The power amplifier 3, the RF component 10, and other various components are mounted using bonding members such as solder H to mounting electrodes 2b provided on a mounting face 2a of the module substrate 2. These components are electrically connected to a plurality of mounting electrodes 5 formed on the back side of the module substrate 2 with a wiring electrode 4 interposed therebetween, which is provided in the module substrate 2, and electrically connected to other components mounted in or on the module substrate 2. The mounting electrodes 5 form a transmission electrode Txa that receives a transmission signal from the outside, a common electrode ANTa that outputs the transmission signal to the outside (antenna device 6) and receives a reception signal from the outside, a reception electrode Rxa that outputs the reception signal inputted to the common electrode ANTa to the outside, and a ground electrode (not illustrated) connected to a ground line (not illustrated).

Wiring electrodes corresponding to various signal lines such as a common line ANT, the ground line, a transmission line Tx, and a reception line Rx are provided in or on the motherboard included in the communication mobile terminal. By mounting the front-end module 1 on the motherboard, these wiring electrodes are connected to the common electrode ANTa, the ground electrode, the transmission electrode Txa, and the reception electrode Rxa, which enables inputting and outputting of transmission signals and reception signals between the motherboard and the front-end module 1.

In the embodiment, the module substrate 2 is formed of a ceramic multilayer body formed by integrally stacking and firing a plurality of dielectric layers formed of a ceramic green sheet. Specifically, a ceramic green sheet that forms the dielectric layers is formed by sheeting slurry in which mixed powder such as alumina and glass is mixed with an organic binder and a solvent. The ceramic green sheet is so-called low-temperature co-fired ceramics fired at a low temperature such as around 1000° C. By performing laser processing or the like, via-holes are formed in the ceramic green sheet cut out in a certain shape, and the formed via-holes are filled with conductive paste including Ag or Cu or plated to fill the via-holes, thereby forming via conductors for inter-layer connection. By printing conductive paste on the front face of the ceramic green sheet, various in-plane conductor patterns are formed, thereby forming each dielectric layer.

By appropriately forming via conductors and in-plane conductor patterns in and on each dielectric layer, various electrodes such as the wiring electrode 4, the mounting electrodes 5, and the mounting electrodes 2b are formed in and on the module substrate 2. At this time, circuit elements such as capacitors and inductors may be formed by the via conductors and the in-plane conductor patterns formed in and on each dielectric layer, and a filter circuit and a rectifier circuit may be formed in the module substrate 2 using the formed circuit elements such as capacitors and inductors. The circuit elements formed in the module substrate 2 using the via conductors and the in-plane conductor patterns may be combined with various components mounted in or on the module substrate 2 to form a filter circuit and a rectifier circuit.

The module substrate 2 can be formed of a printed board, an LTCC, an alumina substrate, a glass substrate, a composite material substrate, a single-layer substrate, or a multi-layer substrate using resin, ceramics, polymer materials, or the like. The module substrate 2 may be formed by selecting an appropriate material in accordance with the purpose of use of the front-end module 1.

The power amplifier 3 amplifies the signal level of a transmission signal inputted from the motherboard of the communication mobile terminal to the transmission electrode Txa and outputs the amplified transmission signal to an input side of the transmission filter through a transmission terminal Txb of the RC component 10. An amplifier circuit included in the power amplifier 3 may be formed of a general power amplifier device such as a heterozygous bipolar transistor or a field-effect transistor, and a description of the detailed configuration of the power amplifier 3 will be omitted.

(RF Component)

The RF component 10 will be described.

(1) Outline of Electrical Configuration

The outline of the electrical configuration of the RF component 10 will be described. As illustrated in FIG. 2, the RF component 10 includes a transmission line SL1 through which a transmission signal passes, a reception line SL2 through which a reception signal passes, a common line SL3 through which a transmission signal and a reception signal pass, a transmission filter 11 provided on the transmission line SL1, a reception filter 12 provided on the reception line SL2, a circulator 13 connected to the lines SL1, SL2, and SL3, the transmission terminal Txb, a common terminal ANTb, a reception terminal Rxb, and a ground terminal (not illustrated).

The transmission terminal Txb is connected to an input side of the transmission filter 11 with the transmission line SL1 interposed therebetween, and an output side of the transmission filter 11 is connected to a third port c of the circulator 13 with the transmission line SL1 interposed therebetween. A first port a of the circulator 13 is connected to the common terminal ANTb with the common line SL3 interposed therebetween. A second port b of the circulator 13 is connected to an input side of the reception filter 12 with the reception line SL2 interposed therebetween, and an output side of the reception filter 12 is connected to the reception terminal Rxb with the reception line SL2 interposed therebetween.

A certain transmission frequency band is set as the passband of the transmission filter 11 (corresponding to a "filter" of the present disclosure). A transmission signal outputted from the power amplifier 3 and inputted to the transmission terminal Txb is filtered by the transmission filter 11 to attenuate a signal outside the certain transmission frequency band, and the attenuated signal is output to the third port c of the circulator 13. A certain reception frequency band is set as the passband of the reception filter 12. A reception signal outputted from the second port b of the circulator 13 is filtered by the reception filter 12 to attenuate a signal outside the certain reception frequency band, and the attenuated signal is output to the reception terminal Rxb.

The transmission filter 11 includes a resonance circuit 11a, and the reception filter 12 includes a resonance circuit 12a. The transmission filter 11 and the reception filter 12 are formed of elastic wave resonators using elastic waves such as surface acoustic waves, bulk acoustic waves, or boundary elastic waves, or formed of general LC filters configured by combining inductors and capacitors.

Specifically, the transmission filter 11 is formed by connecting, for example, a plurality of elastic wave resonators in a ladder shape. The reception filter 12 is formed by connecting in series, for example, an elastic wave resonator that forms a phase shifter and a longitudinally-coupled elastic wave resonator that forms a band-pass filter.

That is, the transmission filter 11 and the reception filter 12 may be configured in any way as long as they are configured to allow RF signals in their certain transmission/reception frequency bands to pass.

The circulator 13 outputs, from the first port a to the common terminal ANTb, a transmission signal that has passed through the transmission filter 11 and inputted to the third port c, and outputs, from the second port b to the reception filter 12, a reception signal inputted to the first port a through the common terminal ANTb.

(2) Stacking Structure

The stacking structure of the RF component 10 will be described. As illustrated in FIG. 1, the RF component 10 includes a first substrate 14, column-shaped spacer members 15 placed on a top face 14a of the first substrate 14 (corresponding to a "first main face of a first substrate" of the present disclosure), a second substrate 16 stacked on the spacer members 15 and vertically (on the plane of FIG. 1) spaced from the first substrate 14, and metal conductors 17 that are included in the spacer members 15 and that establish the electrical connection between the first substrate 14 and the second substrate 16. Note that the space between the first substrate 14 and the second substrate 16 may be filled with general molding resin such as epoxy resin.

The RF component 10 also includes a plurality of components 18 and inductor components 19 mounted on the top face 14a of the first substrate 14, a plurality of components 20 and inductor components 21 mounted on a bottom face 16b of the second substrate 16 (corresponding to a "face facing the first substrate" of the present disclosure). The components 18 to 21 are arranged between the first substrate 14 and the second substrate 16. Therefore, because the components 18 to 21 can be arranged not only in the plane direction but also in the vertical direction of the RF component 10, the degree of component integration of the RF component 10 can be enhanced, and the component size of the RF component 10 in a plan view can be reduced.

Like the module substrate 2, the first substrate 14 is formed of a ceramic multilayer body formed by integrally stacking and firing a plurality of dielectric layers 141, 142, and 143 (corresponding to "insulating layers" of the present disclosure) formed of a ceramic green sheet. Like the module substrate 2, via conductors and in-plane conductor patterns are appropriately formed in and on the dielectric layers 141, 142, and 143, thereby forming internal wiring electrodes 22 in the first substrate 14. Mounting electrodes 23 at which the components 18 and 19 are mounted are formed on the top face 14a of the first substrate 14, and a plurality of external connection terminals 24 are formed on a bottom face 14b of the first substrate 14 (corresponding to "a second main face of the first substrate" of the present disclosure). Like the first substrate 14, the second substrate 16 is formed by stacking a plurality of dielectric layers 161, 162, and 163 (corresponding to "insulating layers" of the present disclosure). Like the first substrate 14, internal wiring electrodes 25 and mounting electrodes 26 at which the components 20 and 21 are mounted are formed in and on the second substrate 16.

As illustrated in areas surrounded by dotted lines in FIGS. 1 and 4 and in FIG. 3, in the embodiment, first no-electrode-forming areas A where the internal wiring electrodes 22 and the external connection terminals 24 are not formed are set to ranges that overlap with the inductor components 19 in a plan view of at least one of the dielectric layers 141 to 143 of the first substrate 14. Second no-electrode-forming areas B where the internal wiring electrodes 25 are not formed are set to ranges that overlap with the inductor components 19 in a plan view of at least one of the dielectric layers 161 to 163 of the second substrate 16.

In the embodiment, as illustrated in FIG. 4, with regard to the dielectric layers 141 and 163, in order not to form the internal wiring electrodes 22 and 25 in the first and second no-electrode-forming areas A and B, via conductors (not illustrated) that connect, in a stacking direction, the mounting electrodes 23 and the internal wiring electrodes 22 formed in plane of the dielectric layers 142 and 143 are formed at positions outside the first no-electrode-forming areas A, and via conductors (not illustrated) that connect, in a stacking direction, the mounting electrodes 26 and the internal wiring electrodes 25 formed in plane of the dielectric layers 161 and 162 are formed at positions outside the second no-electrode-forming areas B. In this manner, the internal wiring electrodes (via conductors and in-plane conductor patterns), the mounting electrodes 23, and the external connection terminals 24 formed in and on the first substrate 14 correspond to a "first wiring electrode" of the present disclosure, and the internal wiring electrodes 25 (via conductors and in-plane conductor patterns) and the mounting electrodes 26 formed in and on the second substrate 16 correspond to a "second wiring electrode" of the present disclosure.

Note that the mounting electrodes 23 for the components 18 on the dielectric layer 141 are not illustrated in FIG. 3, and the mounting electrodes 26 for the components 20 on the dielectric layer 163 are not illustrated in FIG. 3. Only the top face side of the dielectric layers 141 and 142 is illustrated, and, with regard to the dielectric layer 143 on the bottom face 14b side where the external connection terminals 24 are formed, the internal wiring electrode 22 on the top face side and the external connection terminals 24 on the bottom face side are illustrated. Also, FIGS. 11 and 13, to which the following description refers, are illustrated like FIG. 3, and descriptions thereof will be omitted in the following description.

The first substrate 14 and the second substrate 16 can be formed of multilayer substrates such as printed boards, LTCCs, alumina substrates, or composite material substrates using resin, ceramics, polymer materials, or the like. The first substrate 14 and the second substrate 16 may be formed by selecting an appropriate material in accordance with the purpose of use of the RF component 10.

The spacer members 15 are formed in a column shape using an insulating material such as ceramics or resin. In the embodiment, through holes that penetrate through the spacer members 15 in the vertical direction are formed, and the metal conductors 17 are provided in the through-holes. The metal conductors 17 are formed of a metal material such as Au, Ag, Cu, Pt, or Ni that has high thermal conductivity and electrical conductivity. Note that the spacer members 15 may be formed of metal columns that function as the metal conductors 17. Outer electrodes that function as each metal conductor 17 may be formed on a top face and a bottom face, and the outer electrode formed on the top face and the outer electrode formed on the bottom face may be electrically connected using an outer electrode formed on a side face and/or an inner electrode to form various components, which may form each spacer member 15.

The components 18 and 20 and the inductor components 19 and 21 are components for forming the transmission filter 11, the reception filter 12, and the circulator 13. That is, the components of the elastic wave resonators, components such as inductors and capacitors, the components of the circulator circuit, and other circuit components are appropriately selected. The selected components are mounted as the components 18 and the inductor components 19 at the mounting electrodes 23 of the substrate 14 using bonding members such as solder H, and the selected components are mounted as the components 20 and the inductor components 21 at the mounting electrodes 26 of the substrate 16 using bonding members such as solder H.

In the embodiment, the components 18 and 20 are arranged at positions not overlapping with the inductor components 19 and 21 in a plan view. The inductor components 19 and the inductor components 21 are arranged at positions that overlap with each other in a plan view. As described above, the components 18 and 20 correspond to "another component" of the present disclosure, and the inductor components 21 correspond to "another inductor component" of the present disclosure.

In the embodiment, the transmission line SL1, the reception line SL2, and the common line SL3 are formed of the internal wiring electrodes 22 and 25 and the metal conductors 17, and the transmission terminal Txb, the reception terminal Rxb, the common terminal ANTb, and the ground terminal are formed of the external connection terminals 24.

In the embodiment, the components 18 arranged on the top face 14a of the first substrate 14 include components that form the transmission filter 11 (resonance circuit 11a). In the embodiment, the inductor components 19 form at least a part of the transmission filter 11. In the embodiment, circuit elements, such as the transmission filter 11 and the rectifier circuit arranged on the transmission line SL1, are arranged on the first substrate 14. In the embodiment, the components 20 arranged on the bottom face 16b of the second substrate 16 include components that form the reception filter 12 (resonance circuit 12a). In the embodiment, the inductor components 21 form at least a part of the reception filter 12. In the embodiment, circuit elements, such as the reception filter 12 and the rectifier circuit arranged on the reception line SL2, are arranged on the second substrate 16. In the embodiment, the components 18 arranged on the top face 14a of the first substrate 14 include the circulator 13.

(3) Resonance Circuits

The resonance circuit 11a included in the transmission filter 11 and the resonance circuit 12a included in the reception filter 12 will be described. In the embodiment, at least a part of the transmission filter 11 is formed of the resonance circuit 11a, and at least a part of the reception filter 12 is formed of the resonance circuit 12a. In this manner, the transmission filter 11 and the reception filter 12 with stable insertion loss characteristics and attenuation characteristics can be formed using the resonance circuits 11a and 12a.

(3-1) Configuration of Resonance Circuits

An example of the specific configuration of the resonance circuits 11a and 12a will be described with reference to FIGS. 5A to 5G. A resonance circuit illustrated in FIG. 5A is an LC parallel resonance circuit including a capacitor C and an inductor L connected in parallel. A resonance circuit illustrated in FIG. 5B is an LC series resonance circuit including a capacitor C and an inductor L connected in series. A resonance circuit illustrated in FIG. 5C is a resonance circuit formed of an elastic wave resonator eR.

A resonance circuit illustrated in FIG. 5D is a resonance circuit formed of a $2/\lambda$ resonator sR. The $2/\lambda$ resonator sR is formed of the internal wiring electrodes 22 of the first substrate 14, the internal wiring electrodes 25 of the second substrate 16, and the internal wiring electrodes in the components 18 to 21. As illustrated in FIG. 5E, the capacitor C of the LC parallel resonance circuit may be replaced with the elastic wave resonator eR to form a resonance circuit. As illustrated in FIG. 5F, the capacitor C of the LC series resonance circuit may be replaced with the elastic wave resonator eR to form a resonance circuit. As illustrated in FIG. 5G, the $2/\lambda$ resonator sR and an inductor L may be connected in parallel to form a resonator.

The configuration of the resonance circuits 11a and 12a is not limited to those illustrated in FIGS. 5A to 5G, and the resonance circuits 11a and 12a may be formed by arbitrarily selecting and combining circuit elements such as a capacitor C, an inductor L, an elastic wave resonator eR, or a $2/\lambda$ resonator sR with the resonance circuits illustrated in FIGS. 5A to 5G.

Like another example of the specific configuration of the resonance circuits 11a and 12a illustrated in FIG. 6, a variable capacitance element CV may be further connected to the resonance circuits illustrated in FIGS. 5A to 5G to form resonance circuits. In doing so, the resonant frequency of the resonance circuits can be changed by the variable capacitance element CV. The pass (frequency) band and the attenuation (frequency) band of the filters 11 and 12 with the resonance circuits formed by connecting the variable capacitance element CV can be changed by the variable capacitance element CV. In addition, the transmission filter 11 or the reception filter 12 that can cope with a plurality of frequency bands can be formed.

(3-2) Variable Reactance Circuit

A variable reactance circuit will be described.

In the embodiment, if necessary, at least a part of each of the resonance circuits 11a and 12a may be formed of a variable reactance circuit; if necessary, a variable reactance circuit may be connected to each of the resonance circuits 11a and 12a; and/or if necessary, at least a part of each of the transmission filter 11 and the reception filter 12 may be formed of a variable reactance circuit.

Specifically, the capacitor C forming each of the resonance circuits 11a and 12a is replaced with a variable reactance circuit appropriately selected from variable reactance circuits 30 to 34 illustrated in FIGS. 7A to 7E to form the resonance circuits 11a and 12a. If necessary, the inductor L forming each of the resonance circuits 11a and 12a is replaced with a variable reactance circuit appropriately selected from variable reactance circuits 35 and 36 illustrated in FIGS. 8A and 8B to form the resonance circuits 11a and 12a.

If necessary, a variable reactance circuit appropriately selected from the variable reactance circuits 30 to 34 illustrated in FIGS. 7A to 7E and a variable reactance circuit appropriately selected from the variable reactance circuits 35 and 36 illustrated in FIGS. 8A and 8B are connected to each of the resonance circuits 11a and 12a. If necessary, at least a part of each of the transmission filter 11 and the reception filter 12 is formed of a variable reactance circuit appropriately selected from the variable reactance circuits 30 to 34 illustrated in FIGS. 7A to 7E and a variable reactance circuit appropriately selected from the variable reactance circuits 35 and 36 illustrated in FIGS. 8A and 8B.

When at least a part of each of the transmission filter 11 and the reception filter 12 is formed of the variable reactance circuits 30 to 36 as needed, the characteristics of the transmission filter 11 and the reception filter 12 can be changed as follows, for example. That is, when the resonant frequencies of the resonance circuits 11a and 12a are changed by the variable reactance circuits 30 to 36 in accordance with the frequency bands of a transmission signal and a reception signal that pass through the RF component 10, the passband of each of the transmission filter 11 and the reception filter 12 can be changed by the variable reactance circuit.

In doing so, the transmission filter 11 coping with transmission signals in a plurality of frequency bands and the reception filter 12 coping with reception signals in a plurality of frequency bands can be formed. It is thus not necessary to prepare a plurality of transmission filters 11 and a plurality of reception filters 12 for the individual frequency bands. Therefore, the RF component 10 (front-end module 1) capable of coping with a plurality of transmission signals and a plurality of reception signals in different frequency bands can be formed of a single pair of the transmission filter 11 and the reception filter 12, thereby reducing the size of the RF component 10.

In the embodiment, each of the variable reactance circuits 30 to 36 is formed in the components 18 and/or 20. That is, the components 18 and/or 20 including any of the variable reactance circuits 30 to 36 are arbitrarily selected and mounted on the first substrate 14 or the second substrate 16, thereby forming the transmission filter 11 and/or the reception filter 12.

An example of the specific configuration of a variable reactance circuit for changing the capacitive reactance will be described with reference to FIGS. 7A to 7E. Outer electrodes P1, P2, P3, and P4 in the following description are outer electrodes formed on each of the components 18 and 19 in accordance with the configuration of a variable reactance circuit included in each of the components 18 and 19.

Figure 7A:
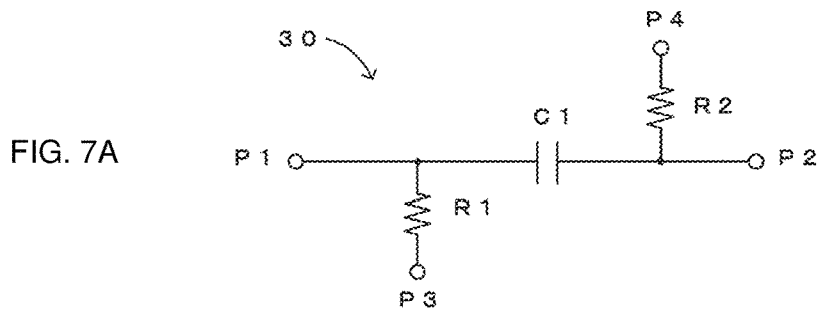
FIGS. 7A to 7E include diagrams illustrating examples of a variable reactance circuit that changes a capacitive reactance, including FIGS. 7A to 7E illustrating different variable reactance circuits.

The variable reactance circuit 30 illustrated in FIG. 7A includes a variable-capacitance capacitor C1 where a dielectric layer is formed of a dielectric material such as (Ba, Sr)TiO$_3$, BaTiO$_3$, SrTiO$_3$, or PbTiO$_3$. By arbitrarily adjusting a voltage applied across the capacitor C1 through first and second resistors R1 and R2 by adjusting a voltage between the third and fourth outer electrodes P3 and P4, the capacitance of the capacitor C1 measured at the first and second outer electrodes P1 and P2 can be changed.

Figure 7B:
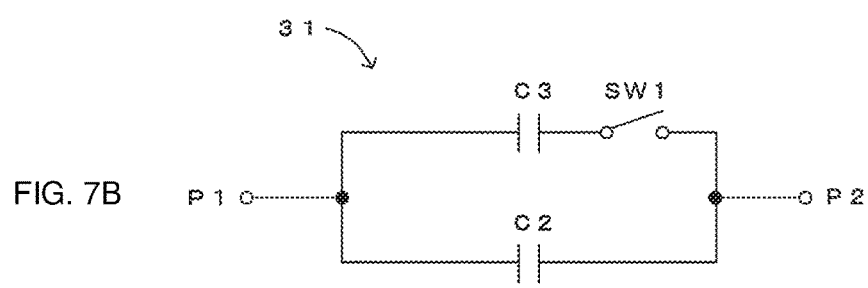
Figure 7C:
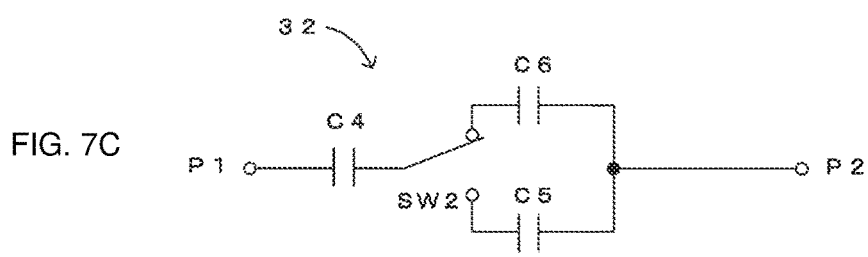

In the variable reactance circuit 31 illustrated in FIG. 7B, the connection status of capacitors C2 and C3 is changed by turning on/off a switch SW1, thereby changing the capacitance between the first and second outer electrodes P1 and P2. In the variable reactance circuit 32 illustrated in FIG. 7C, the connection status of capacitors C4, C5, and C6 is changed by turning on/off a switch SW2, thereby changing the capacitance between the first and second outer electrodes P1 and P2.

Figure 7D:
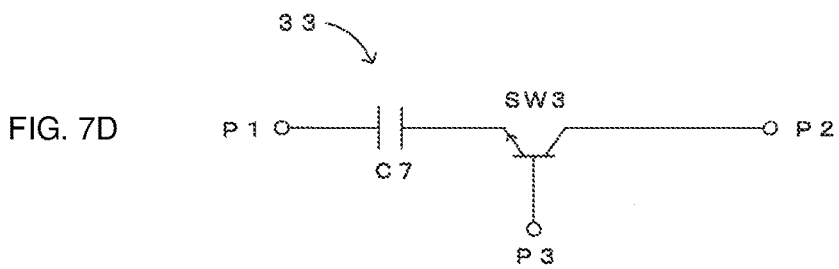

In the variable reactance circuit 33 illustrated in FIG. 7D, the overall capacitance including a capacitor C7 is changed by an off capacitance of a bipolar transistor by turning off a switch SW3 on the basis of a control signal inputted to the third outer electrode P3 (base), thereby changing the capacitance between the first and second outer electrodes P1 and P2.

Figure 7E:
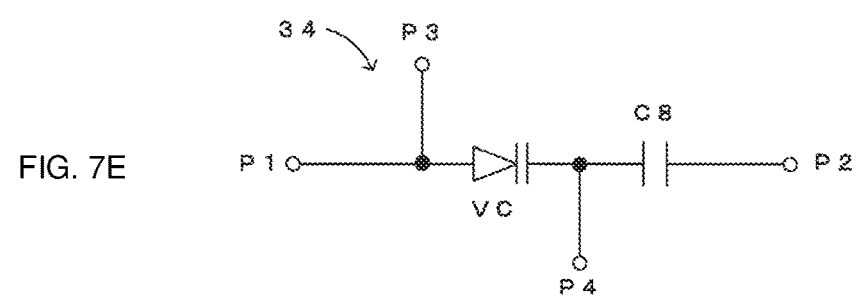

In the variable reactance circuit 34 illustrated in FIG. 7E, the capacitance of a variable capacitance diode VC is changed and the overall capacitance including a capacitor C8 is changed by changing a bias voltage for the variable capacitance diode VC by adjusting the voltage between the third and fourth outer electrodes P3 and P4, thereby changing the capacitor capacitance between the first and second outer electrodes P1 and P2.

An example of the specific configuration of a variable reactance circuit for changing the inductive reactance will be described with reference to FIGS. 8A and 8B.

In the variable reactance circuit 35 illustrated in FIG. 8A, the connection status of inductors L2 and L3 is changed by turning on/off a switch SW4, thereby changing the inductance between the first and second outer electrodes P1 and P2. In the variable reactance circuit 36 illustrated in FIG. 8B, the connection status of inductors L3, L4, and L5 is changed by switching the connection status of a switch SW5, thereby changing the inductance between the first and second outer electrodes P1 and P2.

Note that the configuration of the variable reactance circuit is not limited to those illustrated in FIGS. 7A to 7E and FIGS. 8A and 8B, and a variable reactance circuit may be formed by further combining a capacitor and/or an inductor to each variable reactance circuit. Alternatively, a variable reactance circuit may be formed by arbitrarily combining the variable reactance circuits illustrated in FIGS. 7A to 7E and FIGS. 8A and 8B. A resonance circuit may be integrally formed in the components 18 and 20 including the variable reactance circuits, or a filter with a resonance circuit may be integrally formed in the components 18 and 20 including the variable reactance circuits.

(4) Circuit Configuration of Transmission Filter and Reception Filter

An example of the circuit configuration of the transmission filter 11 and the reception filter 12 will be described. In the embodiment, the transmission filter 11 and the reception filter 12 are formed by connecting the resonance circuits 11a and 12a and the inductor components 19 and 21 as illustrated in, for example, FIGS. 9A to 9C. In the following description, the configuration of the transmission filter 11 will be described, and symbols of the circuit elements of the reception filter 12 corresponding to the circuit elements of the transmission filter 11 are given in parentheses in FIGS. 9A to 9C, thereby omitting the description of the configuration of the reception filter 12.

In the example illustrated in FIG. 9A, two resonance circuits 11a are connected in series with one inductor component 19 interposed therebetween, thereby forming the transmission filter 11. Note that part of one of the two resonance circuits 11a is formed of the inductor component 19. In the example illustrated in FIG. 9B, two resonance circuits 11a are connected in series with one inductor component 19 interposed therebetween. In the example illustrated in FIG. 9C, two resonance circuits 11a are connected in series with a coupling element 27 such as a capacitor or an inductor interposed therebetween, thereby forming the transmission filter 11. Note that a part of one of the two resonance circuits 11a is formed of one inductor component 19. The coupling element 27 is formed of a circuit element formed in the components 18 and 20 or a circuit element configured of the internal wiring electrodes 22 and 25.

At least a part of the resonance circuit 11a may be formed of the inductor component(s) 19, of the component(s) 18 and the inductor component(s) 19, or only of the component(s) 18. A part of the resonance circuit 11a may be formed of the component(s) 18 and/or the inductor component(s) 19, and the remaining part of the resonance circuit 11a may be formed of circuit elements such as capacitors and/or inductors configured of the internal wiring electrodes 22. The resonance circuit 11a may be formed only of circuit elements such as capacitors and/or inductors configured of the internal wiring electrodes 22.

At least a part of the transmission filter 11 may be formed of the inductor component(s) 19, of the component(s) 18 and the inductor component(s) 19, or only of the component(s) 18. A part of the transmission filter 11 may be formed of the component(s) 18 and/or the inductor component(s) 19, and the remaining part of the transmission filter 11 may be formed of circuit elements such as capacitors and/or inductors configured of the internal wiring electrodes 22. The transmission filter 11 may be formed only of circuit elements such as capacitors and/or inductors configured of the internal wiring electrodes 22.

Like the resonance circuit 11a, at least a part of the resonance circuit 12a may be formed of the inductor component(s) 21, of the component(s) 20 and the inductor component(s) 21, or only of the component(s) 20. A part of the resonance circuit 12a may be formed of the component(s) 20 and/or the inductor component(s) 21, and the remaining part of the resonance circuit 12a may be formed of circuit elements such as capacitors and/or inductors configured of the internal wiring electrodes 25. The resonance circuit 12a may be formed only of circuit elements such as capacitors and/or inductors configured of the internal wiring electrodes 25.

Like the transmission filter 11, at least a part of the reception filter 12 may be formed of the inductor component(s) 21, of the component(s) 20 and the inductor component(s) 21, or only of the component(s) 20. A part of the reception filter 12 may be formed of the component(s) 20 and/or the inductor component(s) 21, and the remaining part of the reception filter 12 may be formed of circuit elements such as capacitors and/or inductors configured of the internal wiring electrodes 25. The reception filter 12 may be formed only of circuit elements such as capacitors and/or inductors configured of the internal wiring electrodes 25.

(Insertion Loss Characteristics of Transmission Filter)

The insertion loss characteristics of the transmission filter 11 will be described.

In FIG. 10 illustrating the passband characteristics of the transmission filter 11 of the RF component 10, the horizontal axis represents the frequency (MHz) of a transmission signal, and the vertical axis represents the signal level (dB).

A solid line in FIG. 10 indicates the passband characteristics of the transmission filter 11 in the case where the above-mentioned first no-electrode-forming areas A and second no-electrode-forming areas B are set to the first and second substrates 14 and 16. A dotted line in FIG. 10 indicates the passband characteristics of the transmission filter 11 in the case where the above-mentioned first no-electrode-forming areas A and second no-electrode-forming areas B are not set to the first and second substrates 14 and 16.

As illustrated in FIG. 10, the insertion loss at a frequency M1 in the case where the first no-electrode-forming areas A and the second no-electrode-forming areas B are set is about 3.8 dB, and the insertion loss at the frequency M1 in the case where the first no-electrode-forming areas A and the second no-electrode-forming areas B are not set is about 4.5 dB. Therefore, in the embodiment, the insertion loss of the transmission filter 11 is improved by about 0.7 dB in the case where the first no-electrode-forming areas A and the second no-electrode-forming areas B are set to the first and second substrates 14 and 16.

As described above in the embodiment, the first no-electrode-forming areas A where the internal wiring electrodes 22 and the external connection terminals 24 (first wiring electrode) are not formed are set to ranges that overlap with the inductor components 19 in a plan view of at least one of the dielectric layers 141 to 143 of the first substrate 14, and the second no-electrode-forming areas B where the internal wiring electrodes 25 (second wiring electrodes) are not formed are set to ranges that overlap with the inductor components 19 in a plan view of at least one of the dielectric layers 161 to 163 of the second substrate 16. In doing so, the amount of the first and second wiring electrodes 22, 24, and 25 arranged near the inductor components 19 can be reduced. Thus, eddy currents induced in the first and second wiring electrodes 22, 24, and 25 can be reduced and the power consumption due to the induction of eddy currents is reduced, thereby reducing the equivalent series resistance of the inductor components 19. This can suppress the reduction of the inductance of the inductor components 19 and prevent lowering of the Q value of the inductor components 19. Therefore, the overall component size of the RF component 10 can be reduced without deteriorating the Q value of the inductor components 19 by configuring the RF component 10 with a stacking structure.

Because the effects of the first and second wiring electrodes 22, 24, and 25 on the inductor components 19 become smaller, even if the distance between the first and second wiring electrodes 22, 24, and 25 and the inductor components 19 varies due to the variations in the thickness of each of the dielectric layers 141 to 143 and 161 to 163 or in the mounting positions of the inductor components 19, the variations of the inductance of the inductor components 19 can be reduced. Therefore, the Q value of the inductor components 19 can be enhanced and the variations of the inductance of the inductor components 19 can be suppressed, thereby providing the high-performance RF component 10 with the inductor components 19 in a stable manner.

When at a least part of the transmission filter 11 is formed of the inductor component(s) 19, because the deterioration of the Q value of the inductor component(s) 19 is suppressed, the deterioration of the insertion loss characteristics of the transmission filter 11 can be suppressed, and the deterioration of the filter characteristics such as the attenuation characteristics of the transmission filter 11 can be suppressed.

When the transmission filter 11 includes the resonance circuit 11a and at least a part of the resonance circuit 11a is formed of the inductor component(s) 19, great resonance current flows through the inductor component(s) 19. Thus, the Q value of the inductor component(s) 19 greatly affects the insertion loss of the transmission filter 11. If the Q value is small, the insertion loss of the transmission filter 11 may increase. However, because the deterioration of the Q value of the inductor component(s) 19 is suppressed in the embodiment, the Q value of the inductor component(s) 19 forming at least a part of the resonance circuit 11a through which great resonance current flows can be increased. Therefore, deterioration of the Q value of the resonance circuit 11a can be suppressed, and the Q value of the transmission filter 11 including the resonance circuit 11a is suppressed. Accordingly, the deterioration of the filter characteristics such as attenuation characteristics is suppressed, and the high-performance transmission filter 11 with a small insertion loss can be formed in a stable manner.

Because the variations of the inductance of each inductor component 19 are small in the embodiment, the variations of the resonant frequency of the resonance circuit 11a can be prevented from occurring. Therefore, the transmission filter 11 with stable frequency characteristics can be formed.

As illustrated in FIGS. 9A and 9B, when one inductor component 19 is provided between the two resonance circuits 11a, if the inductance of the inductor component 19 varies, the amount of coupling between the resonance circuits 11a also varies. This may cause the variations of the insertion loss characteristics and attenuation characteristics of the transmission filter 11. However, because the variations of the inductance of the inductor component 19 connecting the two resonance circuits 11a are prevented from occurring, the variations of the amount of coupling between the two resonance circuits 11a can be reduced. Therefore, the high-performance transmission filter 11 with stable insertion loss characteristics and attenuation characteristics can be formed in a stable manner.

By the way, when the resonance circuit 11a has the circuit configuration illustrated in FIG. 6, the variable capacitance element CV can be formed of the variable reactance circuits 30 to 34 described with reference to FIGS. 7A to 7E. However, when the variable reactance circuit includes a switch, it is difficult to obtain a capacitance with a high Q value due to a loss caused at the switch. Thus, when the Q value of the inductor L is low, the insertion loss of the transmission filter 11 including the resonance circuit 11a with the circuit configuration illustrated in FIG. 6 may greatly deteriorate. However, the deterioration of the Q value of each inductor component 19 is suppressed in the embodiment. Therefore, when the resonance circuit 11a is formed by forming the inductor L in the circuit configuration illustrated in FIG. 6 of one inductor component 19 with a high Q value, the deterioration of the insertion loss of the transmission filter 11 including the resonance circuit 11a can be suppressed.

Because a transmission signal with great power amplified by the power amplifier 3 flows through the transmission filter 11, the transmission filter 11 tends to have a high temperature, and the insertion loss tends to deteriorate. However, when at least a part of the transmission filter 11 is formed of the inductor component(s) 19 whose Q value deterioration is suppressed, the transmission filter 11 with a small insertion loss even at a high temperature can be realized.

Because the components 18 and 20 are arranged at positions not overlapping with the inductor components 19 and 21 in a plan view, the components 18 and 20 are prevented from interfering with the inductor components 19 and 21 and deteriorating the characteristics thereof.

Because the inductor components 21 mounted on the bottom face 16b of the second substrate 16 are placed at positions overlapping with the inductor components 19 in a plan view, the deterioration of the characteristics of the inductor components 21 can also be suppressed by the first no-electrode-forming areas A and the second no-electrode-forming areas B. Thus, it is not necessary to newly set no-electrode-forming areas corresponding to the inductor components 21 to each of the first substrate 14 and the second substrate 16. Therefore, each of the first and second substrates 14 and 16 can be reliably provided with areas for forming the first and second wiring electrodes 22, 24, and 25, thereby enhancing the degree of freedom in designing the first and second wiring electrodes 22, 24, and 25 in the first and second substrates 14 and 16.

Because the deterioration of the characteristics of the inductor components 21 are suppressed by the first and second no-electrode-forming areas A and B, the inductor components 21 can achieve the same advantageous effects as the above-mentioned inductor components 19. The resonance circuit 12a including the inductor component(s) 21 can achieve the same advantageous effects as the resonance circuit 11a including the above-mentioned inductor component(s) 19, and the reception filter 12 including the inductor component(s) 21 can achieve the same advantageous effects as the transmission filter 11 including the above-mentioned inductor component(s) 19.

Second Embodiment

Figure 11:
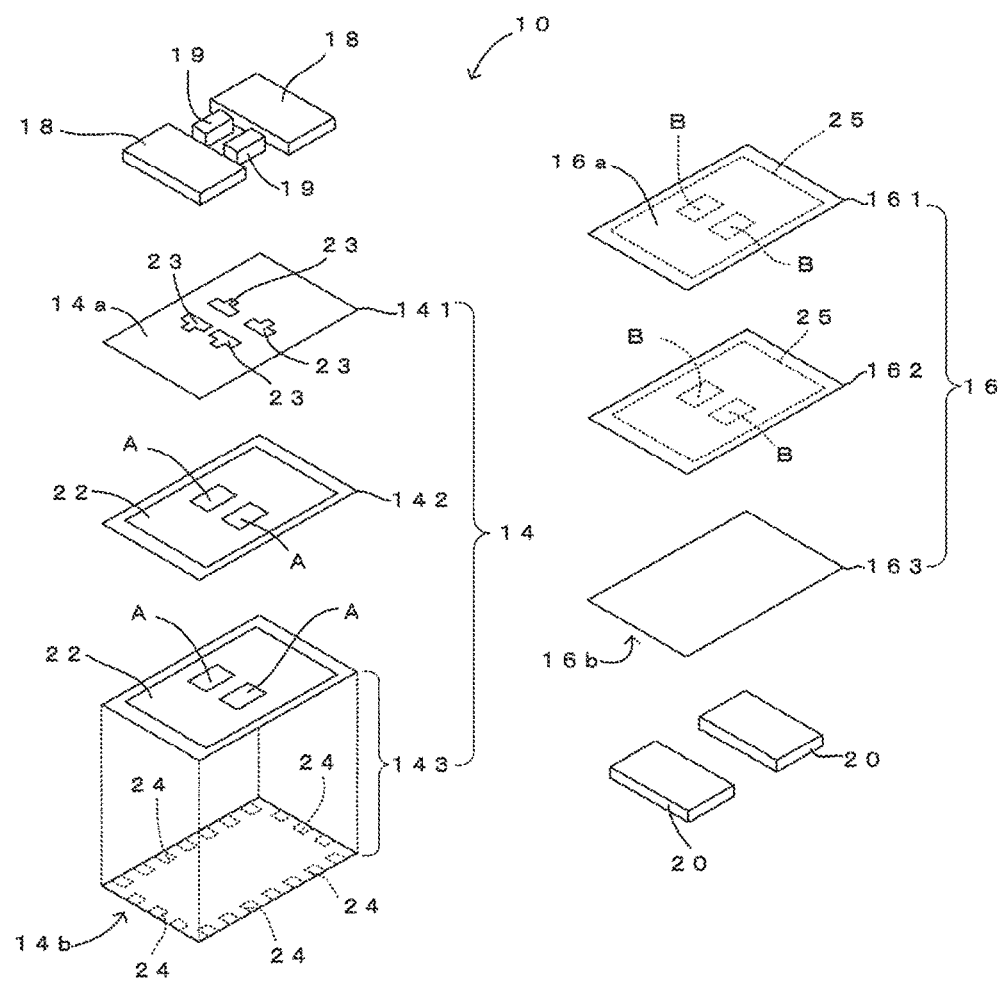
FIG. 11 is an exploded perspective view of an RF component according to a second embodiment of the present disclosure.
Figure 12:
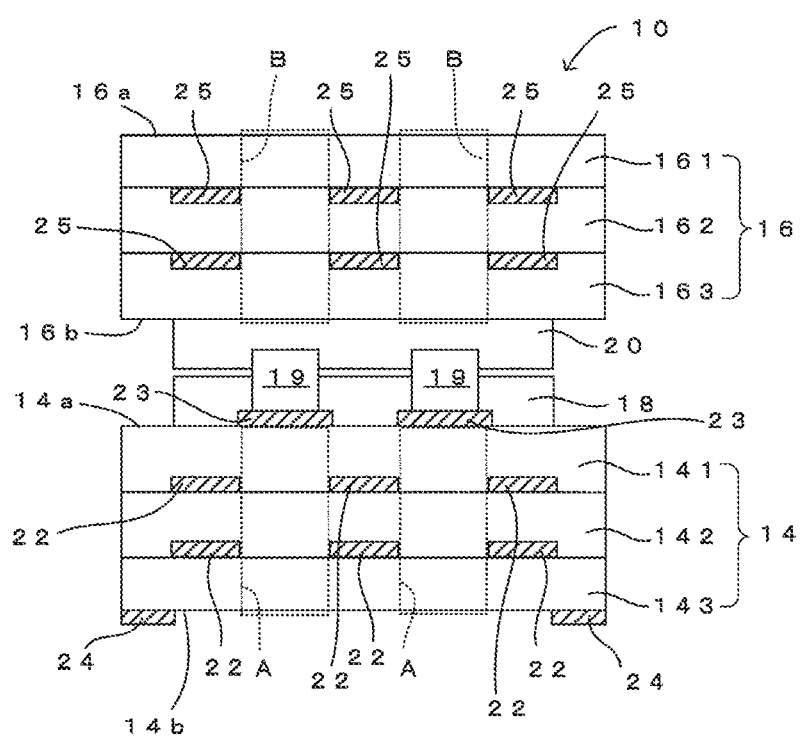
FIG. 12 is a diagram illustrating the arrangement relationship between inductor components and internal wiring electrodes.

Next, an RF component according to a second embodiment of the present disclosure will be described with reference to FIGS. 11 and 12. FIG. 11 is an exploded perspective view of the RF component according to the second embodiment of the present disclosure, and FIG. 12 is a diagram illustrating the arrangement relationship between inductor components and internal wiring electrodes.

This embodiment differs from the above-described first embodiment in the following points. As illustrated in FIGS. 11 and 12, the inductor components 21 are not mounted on the bottom face 16b of the second substrate 16; the first no-electrode-forming areas A are set to ranges that overlap with the inductor components 19 in a plan view of all the dielectric layers 142 and 143 except for the dielectric layer 141 near the top face 14a of the first substrate 14 on which the mounting electrodes 23 are formed; and the second no-electrode-forming areas B are formed within ranges that overlap with the inductor components 19 in a plan view of all the dielectric layers 161, 162, and 163 of the second substrate 16.

In this embodiment, in a plan view, the first and second no-electrode-forming areas A and B are set such that the exterior shape of the inductor components 19 will be arranged inside the first and second no-electrode-forming areas A and B. With regard to the dielectric layer 141 near the top face 14a of the first substrate 14 on which the mounting electrodes 23 are formed, as illustrated in FIG. 12, it is preferable that via conductors that connect the mounting electrodes 23 and the internal wiring electrodes 22 in a stacking direction be formed at positions outside the first no-electrode-forming areas A. Since the other configuration is the same as that of the first embodiment, a description thereof will be omitted by citing the same reference numerals.

With such a configuration, besides the mounting electrodes 23 at which the inductor components 19 are mounted, no other electrodes (the internal wiring electrodes 22 and 25, the external connection terminals 24, and the mounting electrodes 26) are formed within ranges that overlap with the inductor components 19 in a plan view, thereby more effectively suppressing the deterioration of the characteristics such as the Q value of the inductor components 19. Because the Q value of the inductor components 19 can be increased and the variations of the inductance thereof can be reduced, the RF component 10 with a higher performance can be formed in a stable manner.

Third Embodiment

Figure 13:
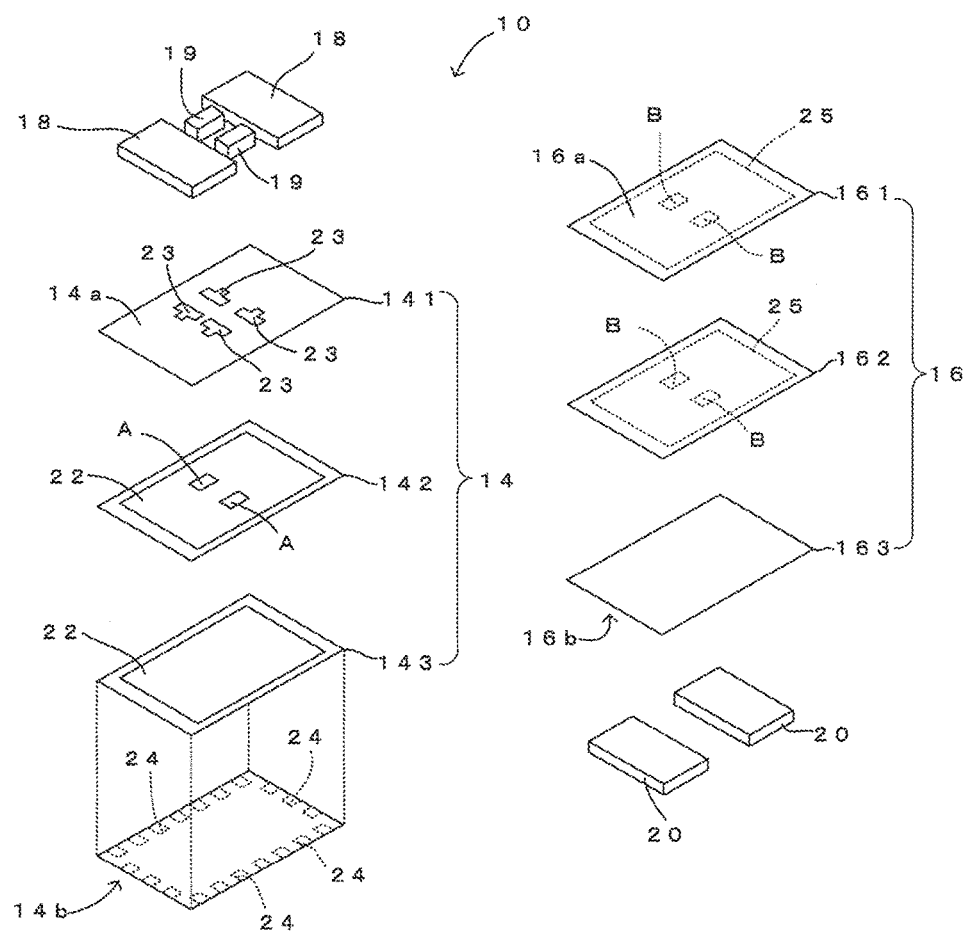
FIG. 13 is an exploded perspective view of an RF component according to a third embodiment of the present disclosure.

Next, an RF component according to a third embodiment of the present disclosure will be described with reference to FIGS. 13 and 14. FIG. 13 is an exploded perspective view of the RF component according to the third embodiment of the present disclosure, and FIG. 14 is a diagram illustrating the arrangement relationship between inductor components and internal wiring electrodes.

Figure 14:
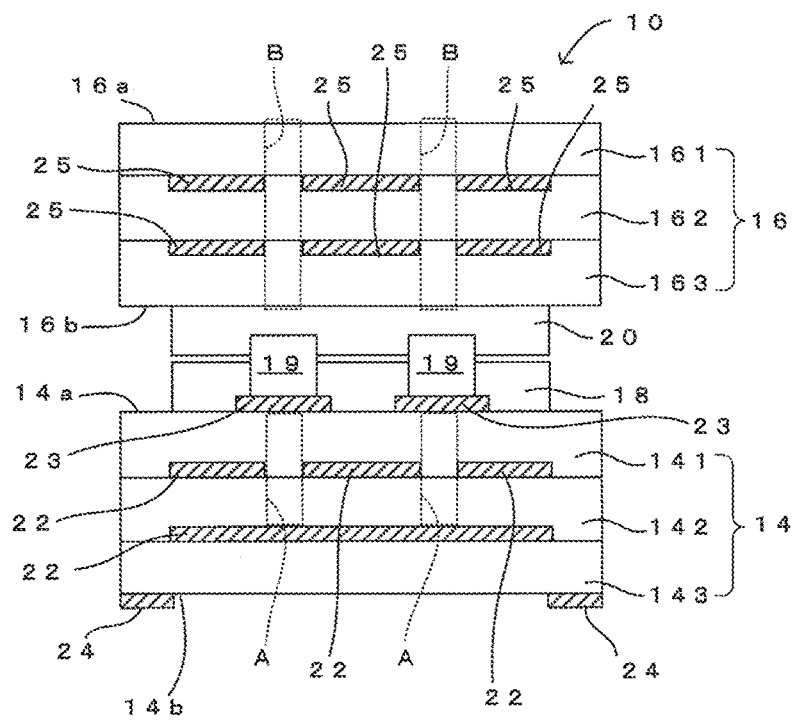
FIG. 14 is a diagram illustrating the arrangement relationship between inductor components and internal wiring electrodes.
Figure 15:
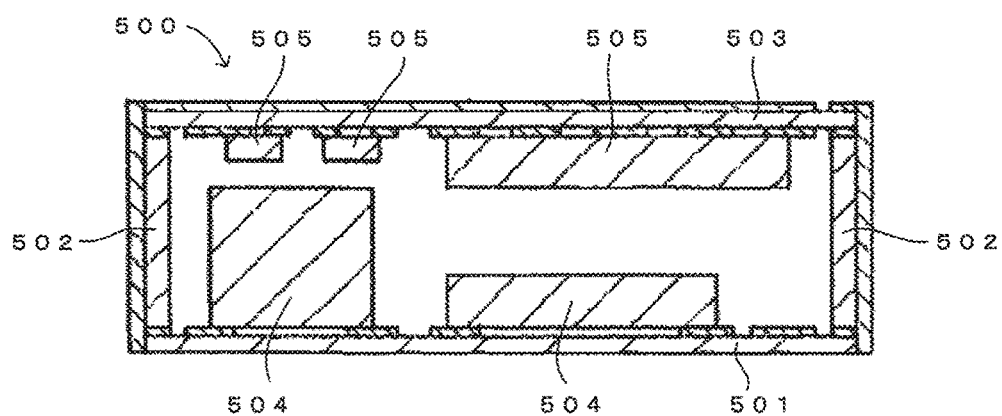
FIG. 15 is a diagram illustrating an RF component with a stacking structure of the related art.

This embodiment differs from the above-mentioned second embodiment in the point that, as illustrated in FIGS. 13 and 14, the first no-electrode-forming areas A are not set to the dielectric layer 143, which is farthest from the inductor components 19 on the first substrate 14. Among the plurality of internal wiring electrodes formed in the first substrate 14, the internal wiring electrode 22 placed nearest to the bottom face 14b, that is, formed on the dielectric layer 143 in this embodiment, is a ground electrode formed in a planar shape. Since the other configuration is the same as that of the first embodiment, a description thereof will be omitted by citing the same reference numerals.

Even with such a configuration, the internal wiring electrodes 22 are not formed on the dielectric layers 141 and 142 close to the inductor components 19, which are greatly affected by the induction of eddy currents. This can suppress deterioration of the Q value of the inductor components 19 and suppress variations of the inductance thereof. At the same time, because internal wiring electrodes can be freely formed in areas outside the first no-electrode-forming areas A of the first substrate 14, the internal wiring electrodes 22 for forming circuit elements such as capacitors and inductors in the first substrate 14 can be efficiently arranged, and size-reduction of the RF component 10 can be realized.

Because the internal wiring electrode 22 formed as a ground electrode in a planar shape is placed on the dielectric layer 143, the heat dissipation of the RF component 10 can be improved. The shielding property of the RF component 10 can also be improved.

The present disclosure is not limited to the above-described embodiments, and various changes other than those described above can be made without departing from the scope of the present disclosure. Configurations included in the above-described embodiments can be combined in any manner. For example, at least a part of the reception filter 12 may be formed of the inductor component(s) 19, and the reception filter 12 may be arranged together with the transmission filter 11 on the first substrate 14. Although the above-described embodiments have been described by using exemplary configurations where at least a part of the filter (transmission filter 11) is formed of the inductor component(s) 19, the inductor component(s) 19 need not form a part of the filter. For example, an RF circuit such as a rectifier circuit may be formed of the inductor component(s) 19.

Although the first substrate 14 side is mounted on the module substrate 2 by forming the external connection terminals 24 on the first substrate 14 in the above-described embodiments, the second substrate 16 side may be mounted on the module substrate 2 by forming external connection terminals on the second substrate 16. Although the transmission filter 11 is given as an example of the "filter" of the present disclosure in the above description, the reception filter 12 or other various filters may be configured as the "filter" of the present disclosure.

A third no-electrode-forming area, like the above-described first and second no-electrode-forming areas A and B, may be formed on each of the dielectric layers forming the module substrate 2. In doing so, lowering of the Q value of the inductor components 19, caused by the effects of the wiring electrode 4 provided in the module substrate 2, can be suppressed, and the variations of the inductance thereof can be suppressed. Therefore, the deterioration of the characteristics of the RF component 10 can be more effectively suppressed, thereby forming the high-performance front-end module 1 and providing a high-performance communication mobile terminal including this front-end module 1.

Other circuit elements may further be arranged in the RF component 10. The power amplifier 3 may be mounted in the RF component 10. An isolator may be further placed at an output side of the transmission filter 11. Instead of the circulator 13, an antenna duplexer such as a switch IC may be mounted in the RF component 10. An antenna duplexer such as the circulator 13 may be mounted on the module substrate 2 side.

Although the above-described embodiments have been described by giving the front-end module 1 by way of example in which one RF component 10 is mounted on the module substrate 2, a front-end module may be formed by mounting two or more RF components 10 on the module substrate 2. In this case, the module substrate 2 may be provided with a switch IC to switchably establish the connection between the common electrode ANTa and one RF component 10 to use, which is selected, using the switch IC, from a plurality of RF components 10 mounted on the module substrate 2.

The present disclosure is widely applicable to an RF component with a stacking structure.

10: RF component
11: transmission filter (filter)
11a: resonance circuit
14: first substrate
14a: top face (first main face)
14b: bottom face (second main face)
16: second substrate
16b: bottom face (facing face)
18, 20: components (other components)
19: inductor component
21: inductor component (another inductor component)
22: internal wiring electrodes (first wiring electrode)
23: mounting electrodes (first wiring electrode)
24: external connection terminals (first wiring electrode)
25: internal wiring electrodes (second wiring electrode)
26: mounting electrodes (second wiring electrode)
141, 142, 143, 161, 162, 163: dielectric layers (insulating layers)
A: first no-electrode-forming area
B: second no-electrode-forming area

The invention claimed is:
1. A radio-frequency component comprising:
a first substrate including one or more first wiring electrodes, and a plurality of stacked insulating layers;

a column-shaped spacer member placed on a first main face of the first substrate;

a second substrate including a second wiring electrode, and a plurality of stacked insulating layers, the second substrate being spaced from the first substrate by being stacked on the column-shaped spacer member; and an inductor component mounted on the first main face of the first substrate, wherein a first no-electrode-forming area where the one or more first wiring electrodes are not formed is set to a range overlapping with the inductor component in a plan view of at least one of the plurality of stacked insulating layers of the first substrate, and wherein a second no-electrode-forming area where the second wiring electrode is not formed is set to a range overlapping with the inductor component in a plan view of at least one of the plurality of stacked insulating layers of the second substrate.

2. The radio-frequency component according to claim 1, further comprising:

a filter, wherein the inductor component constitutes at least a part of the filter.

3. The radio-frequency component according to claim 2, wherein the filter includes a resonance circuit, and the inductor component constitutes at least a part of the resonance circuit.

4. The radio-frequency component according to claim 3, wherein the filter includes a variable reactance circuit.

5. The radio-frequency component according to claim 3, further comprising:

another component placed between the first substrate and the second substrate, wherein the another component is placed at a position not overlapping with the inductor component in a plan view of the radio-frequency component.

6. The radio-frequency component according to claim 3, further comprising:

another inductor component mounted on a face of the second substrate, the face facing the first substrate, wherein the another inductor component is placed at a position overlapping with the inductor component in a plan view of the radio-frequency component.

7. The radio-frequency component according to claim 3, wherein:

the first no-electrode-forming area is set to a range overlapping with the inductor component in a plan view of all of the plurality of stacked insulating layers except for an insulating layer near the first main face of the first substrate, and the second no-electrode-forming area is set to a range overlapping with the inductor component in a plan view of all of the plurality of stacked insulating layers of the second substrate.

8. The radio-frequency component according to claim 2, further comprising:

another inductor component mounted on a face of the second substrate, the face facing the first substrate, wherein the another inductor component is placed at a position overlapping with the inductor component in a plan view of the radio-frequency component.

9. The radio-frequency component according to claim 2, wherein:

the first no-electrode-forming area is set to a range overlapping with the inductor component in a plan view of all of the plurality of stacked insulating layers except for an insulating layer near the first main face of the first substrate, and the second no-electrode-forming area is set to a range overlapping with the inductor component in a plan view of all of the plurality of stacked insulating layers of the second substrate.

10. The radio-frequency component according to claim 2, further comprising:

another component placed between the first substrate and the second substrate, wherein the another component is placed at a position not overlapping with the inductor component in a plan view of the radio-frequency component.

11. The radio-frequency component according to claim 2, wherein the filter includes a variable reactance circuit.

12. The radio-frequency component according to claim 11, further comprising:

another component placed between the first substrate and the second substrate, wherein the another component is placed at a position not overlapping with the inductor component in a plan view of the radio-frequency component.

13. The radio-frequency component according to claim 11, further comprising:

another inductor component mounted on a face of the second substrate, the face facing the first substrate, wherein the another inductor component is placed at a position overlapping with the inductor component in a plan view of the radio-frequency component.

14. The radio-frequency component according to claim 11, wherein:

the first no-electrode-forming area is set to a range overlapping with the inductor component in a plan view of all of the plurality of stacked insulating layers except for an insulating layer near the first main face of the first substrate, and the second no-electrode-forming area is set to a range overlapping with the inductor component in a plan view of all of the plurality of stacked insulating layers of the second substrate.

15. The radio-frequency component according to claim 1, further comprising:

another component placed between the first substrate and the second substrate, wherein the another component is placed at a position not overlapping with the inductor component in a plan view of the radio-frequency component.

16. The radio-frequency component according to claim 15, further comprising:

another inductor component mounted on a face of the second substrate, the face facing the first substrate, wherein the another inductor component is placed at a position overlapping with the inductor component in a plan view of the radio-frequency component.

17. The radio-frequency component according to claim 15, wherein:

the first no-electrode-forming area is set to a range overlapping with the inductor component in a plan view of all of the plurality of stacked insulating layers except for an insulating layer near the first main face of the first substrate, and the second no-electrode-forming area is set to a range overlapping with the inductor component in a plan view of all of the plurality of stacked insulating layers of the second substrate.

18. The radio-frequency component according to claim 1, further comprising:
- another inductor component mounted on a face of the second substrate, the face facing the first substrate,
- wherein the another inductor component is placed at a position overlapping with the inductor component in a plan view of the radio-frequency component.

19. The radio-frequency component according to claim 1, wherein:
- the first no-electrode-forming area is set to a range overlapping with the inductor component in a plan view of all of the plurality of stacked insulating layers except for an insulating layer near the first main face of the first substrate, and
- the second no-electrode-forming area is set to a range overlapping with the inductor component in a plan view of all of the plurality of stacked insulating layers of the second substrate.

20. The radio-frequency component according to claim 1, wherein, among the one or more first wiring electrodes, a first wiring electrode placed nearest to a second main face of the first substrate is a ground electrode formed in a planar shape.

21. The radio-frequency component according to claim 1, further comprising a metal conductor included in the column-shaped spacer member, said metal conductor configured to establish an electrical connection between the first substrate and the second substrate.

* * * * *